United States Patent
Veenstra

(10) Patent No.: US 6,242,946 B1
(45) Date of Patent: *Jun. 5, 2001

(54) EMBEDDED MEMORY BLOCK WITH FIFO MODE FOR PROGRAMMABLE LOGIC DEVICE

(75) Inventor: Kerry S. Veenstra, San Jose, CA (US)

(73) Assignee: Altera Corporation, San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 09/369,409

(22) Filed: Aug. 5, 1999

Related U.S. Application Data

(63) Continuation of application No. 08/834,426, filed on Apr. 14, 1997, now Pat. No. 5,977,791.
(60) Provisional application No. 60/015,443, filed on Apr. 15, 1996.

(51) Int. Cl.$^7$ ................................................. H03K 19/177
(52) U.S. Cl. ................................................. 326/41; 326/40
(58) Field of Search ........................................... 326/37–41

(56) References Cited

U.S. PATENT DOCUMENTS

| | | |
|---|---|---|
| Re. 34,363 | 8/1993 | Freeman . |
| Re. 34,444 | 11/1993 | Kaplinsky . |
| 3,473,160 | 10/1969 | Wahlstrom . |
| 4,020,469 | 4/1977 | Manning . |
| 4,124,899 | 11/1978 | Birkner et al. . |
| 4,293,783 | 10/1981 | Patil . |
| 4,546,273 | 10/1985 | Osman . |
| 4,609,986 | 9/1986 | Hartmann et al. . |
| 4,617,479 | 10/1986 | Hartmann et al. . |
| 4,642,487 | 2/1987 | Carter . |
| 4,670,749 | 6/1987 | Freeman . |

(List continued on next page.)

FOREIGN PATENT DOCUMENTS

| | | |
|---|---|---|
| 081 917 | 8/1983 | (EP) . |
| 410 759 | 1/1991 | (EP) . |
| 415 542 | 3/1991 | (EP) . |
| 420 389 | 4/1991 | (EP) . |
| 507 507 | 10/1992 | (EP) . |
| 530 985 | 3/1993 | (EP) . |
| 569 137 | 11/1993 | (EP) . |
| 746 102 | 12/1996 | (EP) . |
| 01091525 | 4/1989 | (JP) . |
| 01091526 | 4/1989 | (JP) . |
| WO 94/10754 | 5/1994 | (WO) . |
| WO 95/16993 | 6/1995 | (WO) . |

OTHER PUBLICATIONS

Actel Corp., "Integrator Series FPGAs 1200 XL and 3200DX Famile," pp. 1–7 and 1–72 (Apr. 1996).

Actel Corp., "Actel's Reprogrammable SPGAs," Preliminary Advance Information, pp. 1–25 (Oct. 10, 1996).

Altera Corp., "Configuring FLEX 10K Devices," Version 1, Application Note 59, pp. 1–24 (Dec. 1995).

Altera Corp., "Embedded programmable Logic Family FLEX 10K," Data Sheet, Version 1, pp. 1–55 (Jul. 1995).

(List continued on next page.)

Primary Examiner—Michael Tokar
Assistant Examiner—Don Phu Le
(74) Attorney, Agent, or Firm—Townsend and Townsend and Crew LLP

(57) ABSTRACT

An programmable logic device has an enhanced embedded array block for the efficient implementation of logic functions including a random access memory and a first-in, first-out memory. A read address register and a write address register are implemented within the embedded array block. The address registers are coupled with a memory array in the embedded array block without using a resources from a programmable interconnect scheme. The first-in, first-out memory may operate as a dual-port FIFO, without cycle-sharing on the interconnect lines.

26 Claims, 10 Drawing Sheets

U.S. PATENT DOCUMENTS

| | | |
|---|---|---|
| 4,677,318 | 6/1987 | Veenstra . |
| 4,706,216 | 11/1987 | Carter . |
| 4,713,792 | 12/1987 | Hartmann et al. . |
| 4,717,912 | 1/1988 | Harvey et al. . |
| 4,758,985 | 7/1988 | Carter . |
| 4,780,846 | 10/1988 | Tanabe et al. . |
| 4,825,414 | 4/1989 | Kawata . |
| 4,831,591 | 5/1989 | Imazeki et al. . |
| 4,855,958 | 8/1989 | Ikeda . |
| 4,870,302 | 9/1989 | Freeman . |
| 4,871,930 | 10/1989 | Wong et al. . |
| 4,899,067 | 2/1990 | So et al. . |
| 4,912,342 | 3/1990 | Wong et al. . |
| 4,940,909 | 7/1990 | Mulder et al. . |
| 4,963,770 | 10/1990 | Keida . |
| 4,975,601 | 12/1990 | Steele . |
| 5,042,004 * | 8/1991 | Agrawal et al. ....................... 326/40 |
| 5,121,006 | 6/1992 | Pedersen . |
| 5,122,685 | 6/1992 | Chan et al. . |
| 5,241,224 | 8/1993 | Pedersen et al. . |
| 5,247,478 | 9/1993 | Gupta et al. . |
| 5,258,668 | 11/1993 | Cliff et al. . |
| 5,260,610 | 11/1993 | Pedersen et al. . |
| 5,260,611 | 11/1993 | Cliff et al. . |
| 5,274,600 | 12/1993 | Ward et al. . |
| 5,294,975 | 3/1994 | Norman et al. . |
| 5,313,119 | 5/1994 | Cooke et al. . |
| 5,315,178 | 5/1994 | Snider . |
| 5,317,212 | 5/1994 | Wahlstrom . |
| 5,329,460 | 7/1994 | Agrawal et al. . |
| 5,338,982 | 8/1994 | Kawana . |
| 5,343,406 | 8/1994 | Freeman et al. . |
| 5,343,437 | 8/1994 | Johnson et al. . |
| 5,350,954 | 9/1994 | Patel . |
| 5,352,940 | 10/1994 | Watson . |
| 5,357,132 | 10/1994 | Turner . |
| 5,362,999 | 11/1994 | Chiang . |
| 5,365,125 | 11/1994 | Goetting et al. . |
| 5,375,086 | 12/1994 | Wahlstrom . |
| 5,406,525 | 4/1995 | Nicholes . |
| 5,408,434 | 4/1995 | Stansfield . |
| 5,414,377 | 5/1995 | Freidin . |
| 5,426,378 | 6/1995 | Ong . |
| 5,432,719 | 7/1995 | Freeman et al. . |
| 5,550,782 * | 8/1996 | Cliff et al. .............................. 326/40 |
| 5,559,450 | 9/1996 | Ngai et al. . |
| 5,566,123 | 10/1996 | Freidin et al. . |
| 5,570,040 * | 10/1996 | Lytle et al. .............................. 326/41 |
| 5,572,148 * | 11/1996 | Lytle et al. .............................. 326/41 |
| 5,668,771 | 9/1997 | Cliff et al. . |
| 5,705,938 | 1/1998 | Kean . |
| 5,744,980 | 4/1998 | McGowan et al. . |
| 5,777,489 | 7/1998 | Barbier et al. . |
| 5,801,547 | 9/1998 | Kean . |
| 5,804,986 * | 9/1998 | Jones ..................................... 326/40 |
| 5,809,281 | 9/1998 | Steele et al. . |
| 5,835,405 | 11/1998 | Tsui et al. . |
| 5,977,791 * | 11/1999 | Veenstra ................................ 326/40 |
| B1 4,617,479 | 9/1993 | Hartmann et al. . |

OTHER PUBLICATIONS

Altera Corp., "Implementing FIFO Buffers in FLEX 10K Devices," Vers. 1, Applic. Note 66, pp. 1–12 (Jan. 1996).
Altera Corp., "MAX 9000 Programmable Logic Device Family," Data Book, Vers. 2, pp. 119–152 (presentation of the book included pp. iii–viii) (Mar. 1995).
Altera Corp., "MAX 5000," Data Book, vers. 1, pp. 149–160, (presentation of book included pp. iii–ix), (Aug. 1993).
Altera Corp., "Implementing RAM Functions in FLEX 10K Devices," Applic. Note 52, Vers. 1, pp. 1–8 (Nov. 1995).
"AT&T's Orthogonal ORCA Targets the FPGA Future," 8029 Electronic Engineering, 64, No. 786, Jun. 1992, Woolwich, London, GB, pp. 9–10.
AT&T Microelectronics, "Optimized Reconfigurable Cell Array (ORCA) Series Field–Programmable Gate Arrays," Advance Data Sheet, pp. 1–87 (Feb. 1993).
AT&T Microelectronics, "Optimized Reconfigurable Cell Array (ORCA) 2C Series Field–Programmable Gate Arrays (ATT2C12, ATT2C15, and ATT2C22)," Preliminary Data Sheet, pp. 1–103 (Apr. 1994).
Bursky, Dave, "Combination RAM/PLD Opens New Application Options, Packing 2048 Bits of RAM Plus Four 500–Gate Configurable Logic Blocks Lets an EPLD Compete with Standard Cells, Arrays," Product Innovation, Electronic Design, pp. 138 and 140 (May 23, 1991).
Bursky, Dave, "CPDLs Add Dedicated Memory Counters To Up Performance," *Electronic Design*, pp. 141–142, (Mar. 4, 1996).
Bursky, Dave, "FPGA Advances Cut Delays, Add Flexibility," 2328 Electronic Design, 40, No. 20, Oct. 1, 1992, Cleveland, OH, pp. 35–43.
Bursky, Dave, "Shrink Systems with One–Chip Decoder, EPROM, and RAM," Electronic Design, Jul. 28, 1988, pp. 91–94.
Bursky, Dave, "Denser, Faster FPGAs Vie for Gate–Array Applications," 2328 Electronic Design, 41, No. 11, May 27, 1993, Cleveland, OH, pp. 55–75.
Cartier, "Implementing FIFOs in XC4000E RAM," Xilinx, Inc., pp. 1–15 (1995).
Casselman, "Virtual Computing and The Virtual Computer," IEEE, p. 43, (Jul. 1993).
Chip Express Press Release, "The Chip Express QYH500 Laser Gate Array (LPGA) Family Now Supports 3–Volt Custom Designs," www.chipexpress.com/corporate/pressreleases/voltage.html, Santa Clara, 1 page, CA (May 17, 1996).
Chip Express Press Release, "Chip Express Unviels a 200,000 Gate Array LPGA Family with Configurable Embedded SRAM: The CX2000 New Gate Array Architecture Eases Deep Sub–micron Designs," www.chipexpress.com/corporate/pressreleases/cx2000.html, Las Vegas, NV, 1 page (Jun. 3, 1996).
Chip Express Press Release, "Chip Express Announces Low–Production Volume ONEMASK® Gate Arrays Screened to Military Standard 883, Rapid–Turn Laser–Prototyping Used by the Military," Product & Services, Technical Press Releases, www.chipexpress.com/products/pressreleases/onemask.html, Santa Clara, CA, pp. 1–2 (Aug. 21, 1995).
Chip Express Press Release, "Technical Overview: RAM Block Diagrams," Product & Services, Technical Information, www.chipexpress.com/products/appnotes/ramblock.htlm (Nov. 25, 1996).
Chip Express Press Release, "CX2000, $0.6\mu$ High–Performance, Fast–Turn ASIC," www.chipexpress.com/products/datasheets/cx2000.htlm, pp. 1–3 (Dec. 12, 1996).
EDN Design Feature, "Embedded Memory Enhances Programmable Logic for Complex Compact Designs," pp. 91–92, 94, 96, 98, 100–102, 106 (Nov. 7, 1996).
Hsieh et al., "Third Generation Architecture Boosts Speed and Density of Field Programmable Gate Arrays," Proceedings of IEEE CICC Conf., pp. 31.2.1–31.2.7 (1990).

Kautz, "Cellular Logic in Memory Arrays," *IEEE Trans. on Computers*, C–18(8):719–727 (1969).

Kawana, Keiichi et al., "An Efficient Logic Block Interconnect Architecture for User–Reprogrammable Gate Array," IEEE 1990 Custom Integrated Circuits Conference, May 1990, CH2860–5/90/0000–0164, pp. 31.3.1–4.

Landry, Steve, "Application–Specific ICs, Relying on RAM, Implement Almost Any Logic Function," Electronic Design, Oct. 31, 1985, pp. 123–130.

Larsson, T, "Programmable Logic Circuits: The Luxury Alternatives are Coming Soon," *Elteknik–med–Aktuell Elektronik*, 4: 37–8, (Feb. 25–Mar. 9, 1988) (with English abstract).

Lattice Semiconductor Corp., "ispLSI and pLSI 6192, High Density Programmable Logic with Dedicated Memory and Register/Counter modules," Data Book, pp. 2–287 to 2–347 (1996).

Lattice Semiconductor Corp., "6000 Family Architectural Description," Data Book, pp. 2–39 to 2–41 (1996).

Ling et al., "WASMII: A Data Driven Computer on a Virtual Hardware," Proc. of IEEE Field Prog. Custom Computing Machines Conf., Napa, California, pp. 33–42 (1993).

Manning, "An Approach to Highly Integrated Computer Maintained Cellular Arrays," *IEEE Trans. on Computers*, C–26(6):536–552 (1977).

Masumoto, Rodney T., "Configurable On–Chip RAM Incorporated into High Speed Logic Array," IEEE Custom Integrated Circuits Conference, Jun. 1985, CH2157–6/85/0000–0240, pp. 240–243.

Ngai, Kai–Kit Tony, "An SRAM–Programmable Field–Reconfigurable Memory," UMI Dissertation Services, Jun. 1994, University of Toronto, pp. i–68.

Patil et al., "A Programmable Logic Approach for VLSI," *IEEE Trans. on Computers*, C–28(9):594–601 (1979).

Plus Logic "FPSL5110 Intelligent Data Buffer" Product Brief, Plus Logic, Inc., San Jose, California, Oct. 1990, pp. 1–6.

Quenot et al., "A Reconfigurable Compute Engine for Real–Time Vision Automata Prototyping," Proc. of IEEE FCCM Conf., Napa, California, pp. 91–100, (Feb. 1994).

Quinnell, Richard A., "FPGA Family Offers Speed, Density, On–Chip RAM, and Wide–Decode Logic," EDN Dec. 6, 1990, pp. 62–63.

Satoh, Hisayasu et al., "A 209K–Transistor ECL Gate Array with RAM," *IEEE Jor. of Solid–State Circuits*, 24(5):1275–1279 (Oct. 1989).

Seitz, "Concurrent VLSI Architectures," *IEEE Trans. on Computers*, C–33(12):1247–1265 (1984).

Shubat, Alexander et al., "A Family of User–Programmable Peripherals with a Functional Unit Architecture," IEEE Jor. of Solid–State Circuits, vol. 27, No. 4, Apr. 1992, 0018–9200/92$03.00, pp. 515–529.

Smith, Daniel, "Intel's FLEXlogic FPGA Architecture," IEEE 1063–6390/93, Wilton [29], 1993 pp. 378–384.

Stone, "A Logic in Memory Computer," *IEEE Trans. on Computers*, pp. 73–78 (1970).

Xilinx Corp., "XC4000, XC4000A, XC4000H Logic Cell Array Families," pp. 2–7 to 2–102 (presentation of book included), (1994, revised Apr. 1995).

\* cited by examiner

EMBEDDED MEMORY BLOCK WITH FIFO MODE FOR PROGRAMMABLE LOGIC DEVICE

This application claims the benefit of Provisional Application Serial No. 60/015,443, filed Apr. 15, 1996, incorporated herein by reference.

This application is a continuation of Ser. No. 08/834,426, filed Apr. 14, 1997, U.S. Pat. No. 5,977,791.

BACKGROUND OF THE INVENTION

The present invention relates generally to the field of integrated circuits and their operation, and more specifically to devices known in the industry as programmable logic devices. In particular, one embodiment of the present invention provides a programmable logic device with enhancements for efficient implementation of a first-in, first-out (FIFO) memory device.

Programmable logic devices have found particularly wide application in the industry. Their versatility, low design cost, and ease of use have combined to make these devices widely used in the logic design process. Programmable logic devices (sometimes referred to as PLDs, PALs, PLAs, FPLAs, EPLDs, EEPLDs, LCAs, or FPGAs,) are well known integrated circuits that combine the advantages of fixed integrated circuits with the flexibility of custom-designed integrated circuits.

The distinguishing feature of a programmable logic device is the ability of a user to electronically program a standard, off-the-shelf part to perform logic functions to meet the user's individual needs. Their use is well-known in the industry and are described, for example, in U.S. Pat. No. 4,617,479, which is incorporated herein by reference for all purposes. Such devices are currently represented, for example, by Altera's MAX® series of PLDs and Altera's FLEX® series of embedded PLDs.

A technique by which programmable logic devices have been implemented uses multiple blocks of configurable logic which are interconnected by some type of interconnection system. These configurable logic blocks are electronically programmable to provide desired logic functions. In order to provide efficient implementation of different functions, the configurable logic blocks are sometimes specially designed for certain applications. For example, one type of configurable logic block is a logic array block (LAB). LABs are designed to be useful in implementing generalized logic functions. Another type is an embedded array block (EAB). EABs are specially designed for implementing memories and other specialized logic functions. Often, different types of configurable logic blocks are provided within a single programmable logic device. This gives a user flexibility in realizing desired logic functions.

The configurable logic blocks are typically coupled together by an interconnection system. For example, a popular programmable logic device provides an interconnect grid to connect different configurable logic blocks to each other and also to input/output ports. This interconnect grid typically comprises sets of horizontal conductors and vertical conductors which are programmably connected to the configurable logic blocks and the input/output ports.

In addition to the interconnect grid, often each of the configurable logic blocks have local interconnect systems. These local interconnects are conductors which provide either fixed or programmable routing of signals within the configurable logic block.

Altera's FLEX® 10K line is an example of a product that provides both logic array blocks and embedded array blocks in a single programmable logic device. The embedded array blocks and logic array blocks are coupled by an innovative interconnect system. The FLEX® 10K line is described, for example, in the Altera Data Book, June 1996 and U.S. Pat. Nos. 5,241,224 and 4,871,930, which are included herein by reference for all purposes.

A common application for which a programmable logic device may be used is a first in, first-out (FIFO) memory. A FIFO is a particular memory scheme in which data is read out from the memory in the same order in which it was written into the memory. As is well known in the art, the implementation of such a device may include, for example, two counters and a memory array. One of the counters is a pointer to the next address from which data is to be read, while the second counter is a pointer to the next address to which data is to be written.

According to the present state of the art, multiple configurable logic blocks are used to design such a FIFO in a programmable logic device. Typically, for example, the counters are implemented in a logic array block or other configurable logic block. The memory array is implemented in a second configurable logic block, for example, an embedded array block. In such an arrangement, two sets of address lines are routed from the counters in the logic array block to the memory array in the embedded array block.

Routing of signals throughout a programmable logic device is a significant issue. Often, the number of available conductors is limited. The space required for introducing more conductors is significant. In a generalized device such as a programmable logic device, it is particularly desirable that the number of interconnections be as low as possible, while still allowing the user to implement common functions. By keeping the number of interconnections at a minimum, more of the space is available for implementing logic functions.

It is apparent from the above, that an improved programmable logic device is desirable. The present invention recognizes the desirability of implementing a FIFO memory in a programmable logic device while saving the number of conductors of the interconnect system that must be utilized.

SUMMARY OF THE INVENTION

The present invention provides a configurable logic block for use in a programmable logic device which allows for the implementation of a first-in, first-out memory while saving programmable interconnect lines.

In accordance with the present invention is a configurable logic block for a programmable logic device that is configurable as a first-in, first-out memory in a first mode (i.e. FIFO mode). The configurable logic block comprises a memory array having a plurality of memory cells arranged in a random access memory format with address lines for uniquely addressing each of the memory cells. The configurable logic block further comprises a first register which is coupled to the address lines of the memory array. The first register contains the write address for the memory array when in the FIFO mode. A second register is coupled to address lines of the memory array and contains the read address for the memory when in the FIFO mode. The first and second registers may be implemented, for example, using counters. Finally, the configurable logic block has a local interconnect that is coupled to the memory array, the first register, and the second register.

In one embodiment, the memory array has separate write address lines coupled with the first register and read address lines coupled with the second register, thereby forming a dual-port memory. Another embodiment of the present invention has an address input multiplexer that selectively couples the first register and the second register to the address lines of the memory arrays. During a write phase, the first register is connected to the address lines and during a read phase the second register is connected to the address lines.

According to the present invention, to save interconnect lines, the first register and the second register may be coupled to the address lines of the memory array without using the local interconnect. The local interconnect is used to provide control signals to the first and second register, along with control signals for the memory array.

The configurable logic blocks described above may be programmably cascaded and combined together to create larger blocks of memory. In this manner, different sizes of memories may be created, depending on the needs of the user.

The configurable logic block of the present invention may be implemented as part of a programmable logic device. For example, the programmable logic device may have a first type of configurable logic block that provides general logic, and a second type of configurable logic block that is configurable as a random access memory or as a FIFO as described above. These two types of configurable logic blocks may be located within an interconnection grid that allows each of the blocks to be programmably coupled together.

Further features of the invention, its nature and various advantages will be more apparent from the accompanying drawings and the following detailed description of the preferred embodiments.

DESCRIPTION OF THE PREFERRED EMBODIMENT

Figure 1:
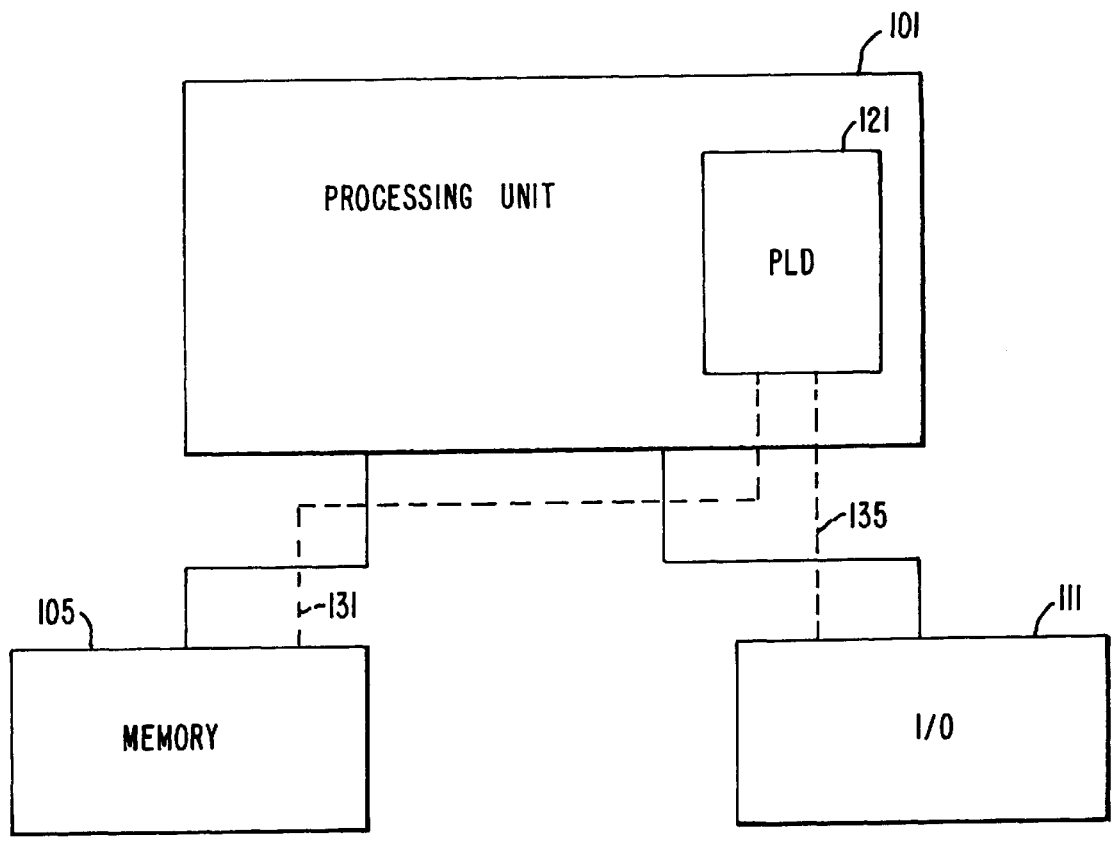
FIG. 1 is a diagram of a digital system incorporating a programmable logic device.

FIG. 1 illustrates a typical environment in which the present invention may be embodied. A digital system has a processing unit 101 which is coupled with a memory 105 and an input/output device 111. A personal computer is one example of such a digital system. However, a wide variety of electronics and consumer products will find beneficial use from the present invention. For example, the present invention will be useful in digital systems in the areas of telecommunications, switches, networking systems, and many other applications.

Processing unit 101 contains one or more programmable logic devices 121 of the type described in the present invention. In other embodiments of this invention, one or more programmable logic devices 121 are contained within input/output device 111 or memory 105.

The digital system of FIG. 1 may be embodied on a single board, on multiple boards, or even within multiple enclosures. Furthermore, the system may have any multiple or combination of the elements shown. For example, a digital system may have multiple processing units 101, or no processing unit 101 at all. One of the advantages of programmable logic device 121 is its logical flexibility. Consequently, one of skill in the art can readily see many applications for utilizing such a device within a variety of digital systems.

Figure 2:
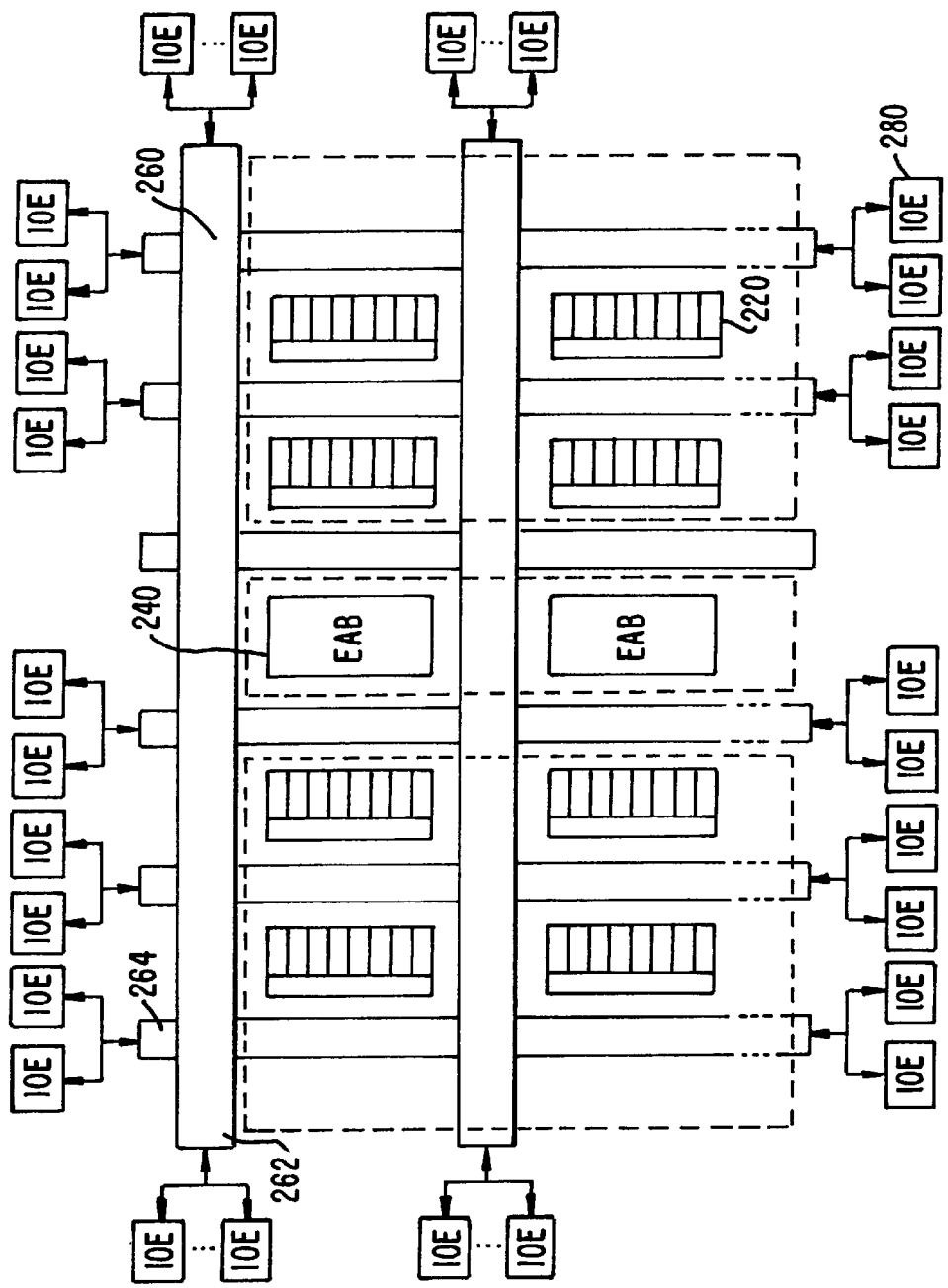
FIG. 2 is a block diagram of a programmable logic device.

By way of example, FIG. 2 depicts the layout an Altera FLEX® 10K embedded programmable logic device. This is one example of a device for which the present invention is well suited. The device is comprised of logic arrays blocks 220, embedded array blocks 240, interconnect grid 260, and input/output elements 280. Logic array blocks 220 are depicted in more detail in FIG. 3 and embedded array blocks 240 are shown in FIG. 4.

Interconnect grid 260 is comprised of sets of horizontal conductors 262 and sets of vertical conductors 264 that are configured in a grid pattern. Within interconnect grid 260 is an array of logic array blocks 220 and embedded array blocks 240. Each of these blocks are programmably connectable to horizontal conductors 262 and vertical conductors 264 of interconnect grid 260. Interconnect grid 260 is also programmably connectable to input/output elements 280. By programming a connection between input/output elements 280, logic array blocks 220 and embedded array blocks 240 through horizontal conductors 262 and vertical conductors 264, the user may create desired logical functions. Interconnect grid 260 is described in detail, for example, in U.S. Pat. No. 5,260,610, which is incorporated herein by reference for all purposes.

Figure 3:
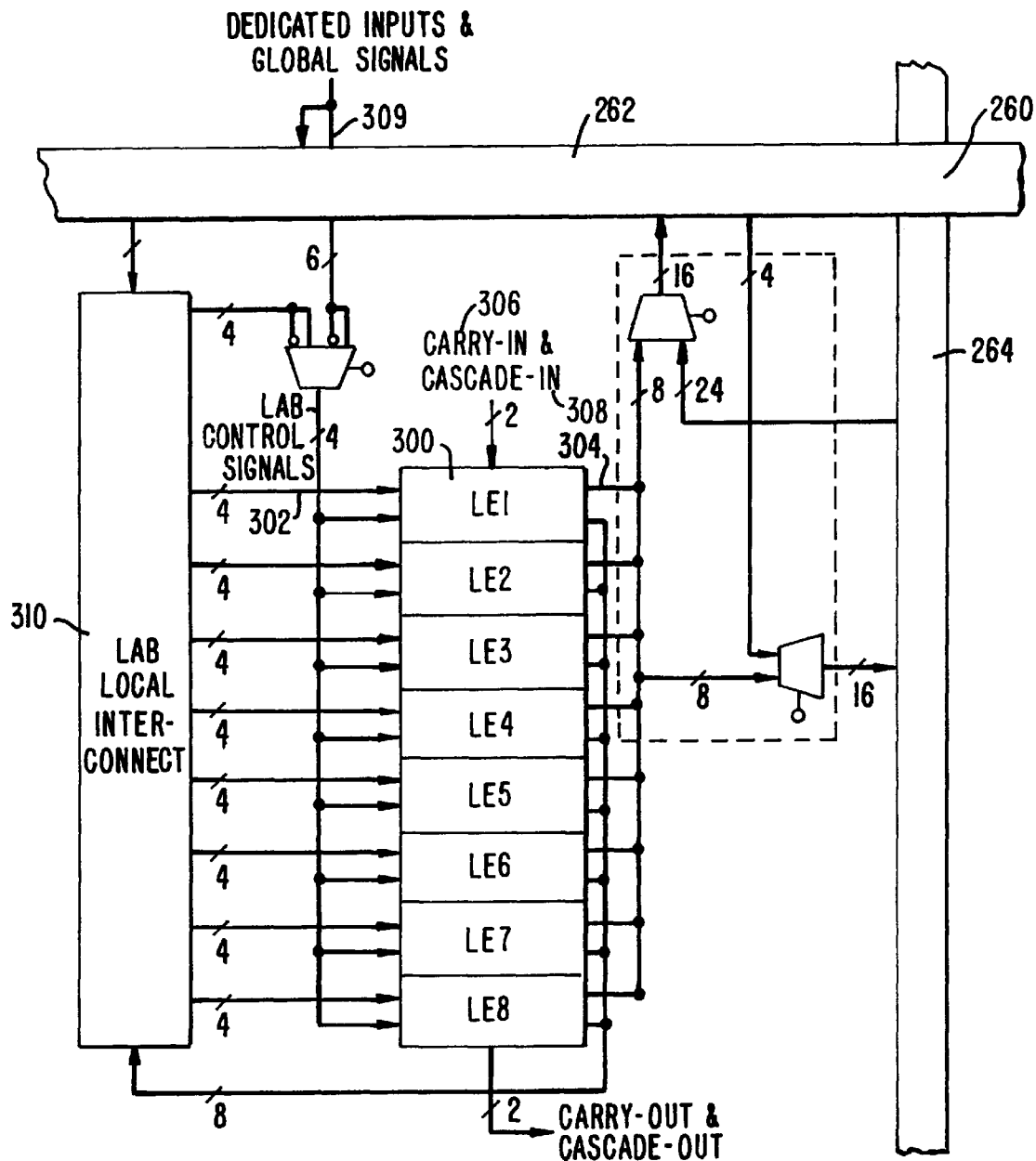
FIG. 3 is a more detailed diagram of a logic array block (LAB) in a programmable logic device.
Figure 4:
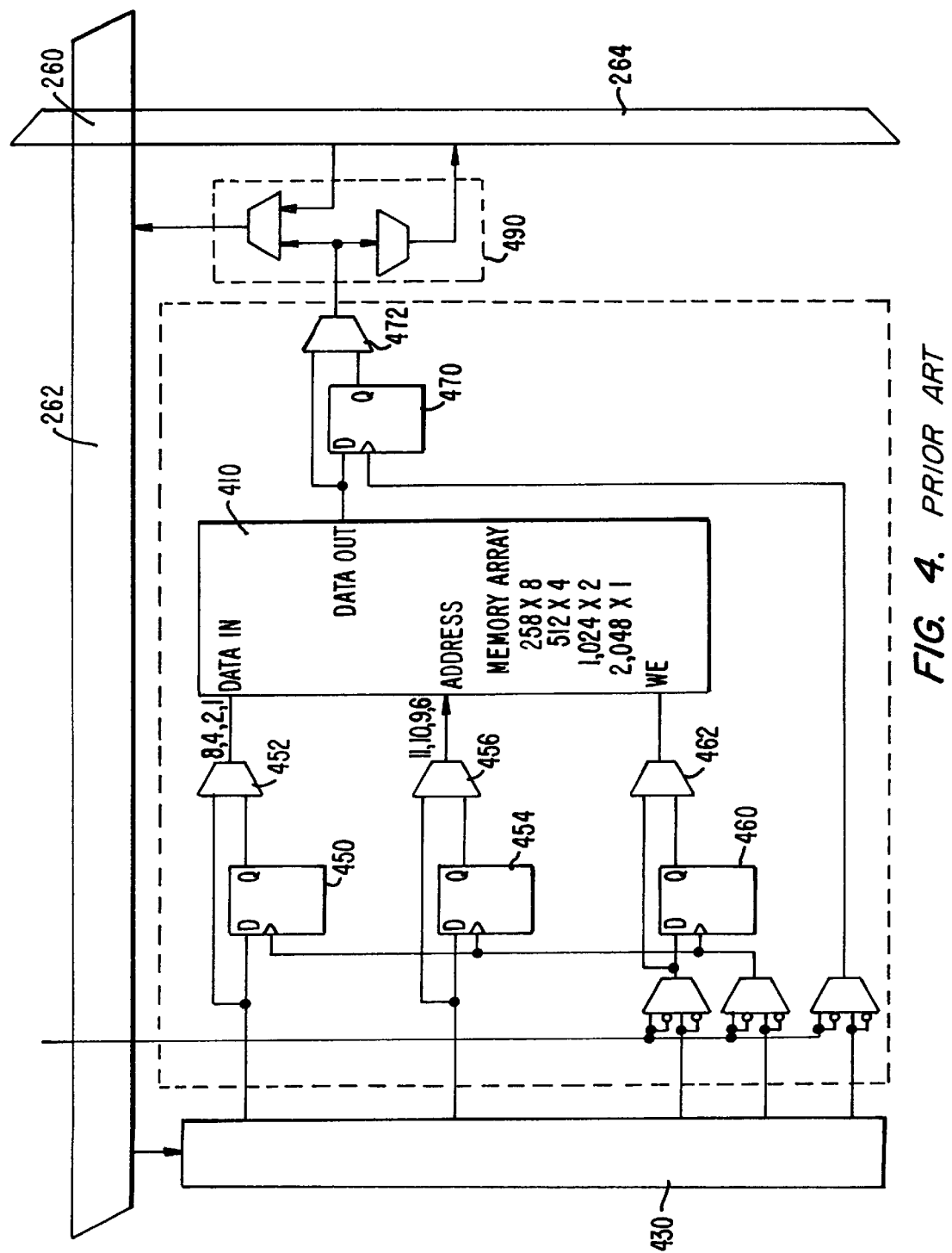
FIG. 4 is a more detailed diagram of an embedded array block (EAB) in a programmable logic device.

Referring to FIG. 3, an example of logic array block 220 is depicted. Logic array block 220 is a configurable logic block which can be configured to provide general logic functions. Each logic array block 220 has a set of logic elements 300 which perform the logical operations. Each logic element 300 provides desired logical outputs based on the inputs provided to it. For example, logic element 300 may be a look-up table, a set of AND-gates, NAND-gates, OR-gates and/or NOR-gates that provide sum of products terms, product of sum terms, or other methods of producing desired logical functions.

In the example of FIG. 3, logic array block 220 contains a set of eight logic elements 300. Each of logic elements 300 has four inputs 302 and one output 304. There are also separate carry-in inputs 306, cascade-in inputs 308 and other control inputs 309 which simplify the chaining of multiple logic array blocks 220 together. The output 304 of a logic element 300 is determined by looking up in a configurable table the desired output for each combination of inputs.

Each logic array block 220 also has an LAB local interconnect 310 which provides local connections between logic elements 300 and also local connections between horizontal conductors 262 of interconnect grid 260 and inputs to the logic elements 300. LAB local interconnect 310 is programmably configurable to allow flexibility to the user in designing logic function.

The outputs of logic elements 300 are also programmable coupled to horizontal conductors 262 and vertical conductors 264 of interconnect grid 260. By this structure, the output of the LAB may be routed to other configurable logic blocks 300 within the programmable logic device.

The structure of the logic array block is described in more detail in, for example, the *Altera Data Book,* June 1996, and U.S. Pat. No. 5,260,611, which are incorporated herein by reference for all purposes.

FIG. 4 is a diagram of an example of embedded array block 240. It is a configurable logic block which is comprised of a memory array 410; a local interconnect 430; input registers 450, 454, and 460; an output register 470; and numerous routing multiplexers 452, 456, 462, 472, and 490. Local interconnect 430 routes data, address, and control information within embedded array block 240. It is programmably connectable to interconnect grid 260.

Embedded array block 240 may be operated either synchronously or asynchronously. Synchronous operation is that in which the write enable input (WE) to memory array 410 is timed with respect to the system clock. The user does not have to be concerned with separate timing specifications for the memory array 410 and need only meet the setup and hold times of the system clock. For asynchronous operation, the user provides the write enable input (WE) and the data and address input signals must meet the required timing specifications in relation to the write enable signal. Internal registers 450, 454, 460, and 470 are provided which allow the input signals to be latched for synchronous operation or bypassed for asynchronous operation. The details of this arrangement are described below.

Memory array 410 is comprised of a plurality of memory cells arranged as a random access memory. Memory array 410 may be programmably configurable to different sizes. For example, it may be programmably configurable as a 256×8, 512×4, 1024×2 or 2,048×1 memory block. A two-bit register (not shown) may be provided whereby each of the four configurations is identified by different combinations of bits in the two-bit register. More configurations may be implemented by increasing the size of the register to allow each configuration to be uniquely identified. Furthermore, it is anticipated that larger or smaller memory arrays may be implemented without departing from the spirit of the present invention.

The first number in the configuration descriptions above (i.e. 256×8) is the depth of the memory array. The depth of the memory array is the number of memory locations that are addressable. The second number is the width of the memory array or the number of bits in each memory location. For example, a 256×8 memory block is a memory block that contains 256 eight-bit memory locations. Similarly a 2,048×1 memory block contains 2,048 unique one-bit locations. A user of embedded array block 240 may programmably configure memory array 410 to be whichever size is more applicable to the application for which it is being used. As would be recognized by one of skill in the art, the number of address lines used to uniquely address each of these configurations is 8, 9, 10, and 11 respectively. For example, eight address lines are needed to uniquely address 256 locations.

Data is input to memory array 410 on data-in lines of memory array 410 via local interconnect 430. These data-in lines are coupled either directly to local interconnect 430 or though a data input register 450. Whether the connection is direct or through data input register 450, is determined by a routing multiplexer 452 which is programmably configurable by the user. This provides the user with a choice of synchronous operation by using data input register 450, or asynchronous operation by bypassing it.

Similarly, the address is input on the address lines of memory array 410 through local interconnect 430 either directly or through an address input register 454. Whether the address lines are connected directly to local interconnect 430, or pass through address input register 454 is determined programmably by the user through a second routing multiplexer 456.

Memory array 410 also has a write enable input (WE). When this signal is asserted, the data on the data-in lines is written to whatever address of memory array 410 is specified on the address lines. The write enable signal is generated by global control signals and control signals from the local interconnect 430. As with the data and address signals, using routing multiplexer 462, the user may select either a direct signal or one that has been latched in write enable register 460.

The output data is latched into data output register 470. A routing multiplexer 480 selectively connects either the latched data or the raw output data to interconnect output multiplexer 490. Interconnect output multiplexer 490 routes the signal to either horizontal conductors 262 or vertical conductors 264 of interconnect grid 260.

Data is written to memory array 410 by placing the data on the data-in lines, a write address on the address lines and asserting the write enable line. Data is read from memory array 410 by placing a read address on the address lines and sampling the data output lines.

Figure 5:
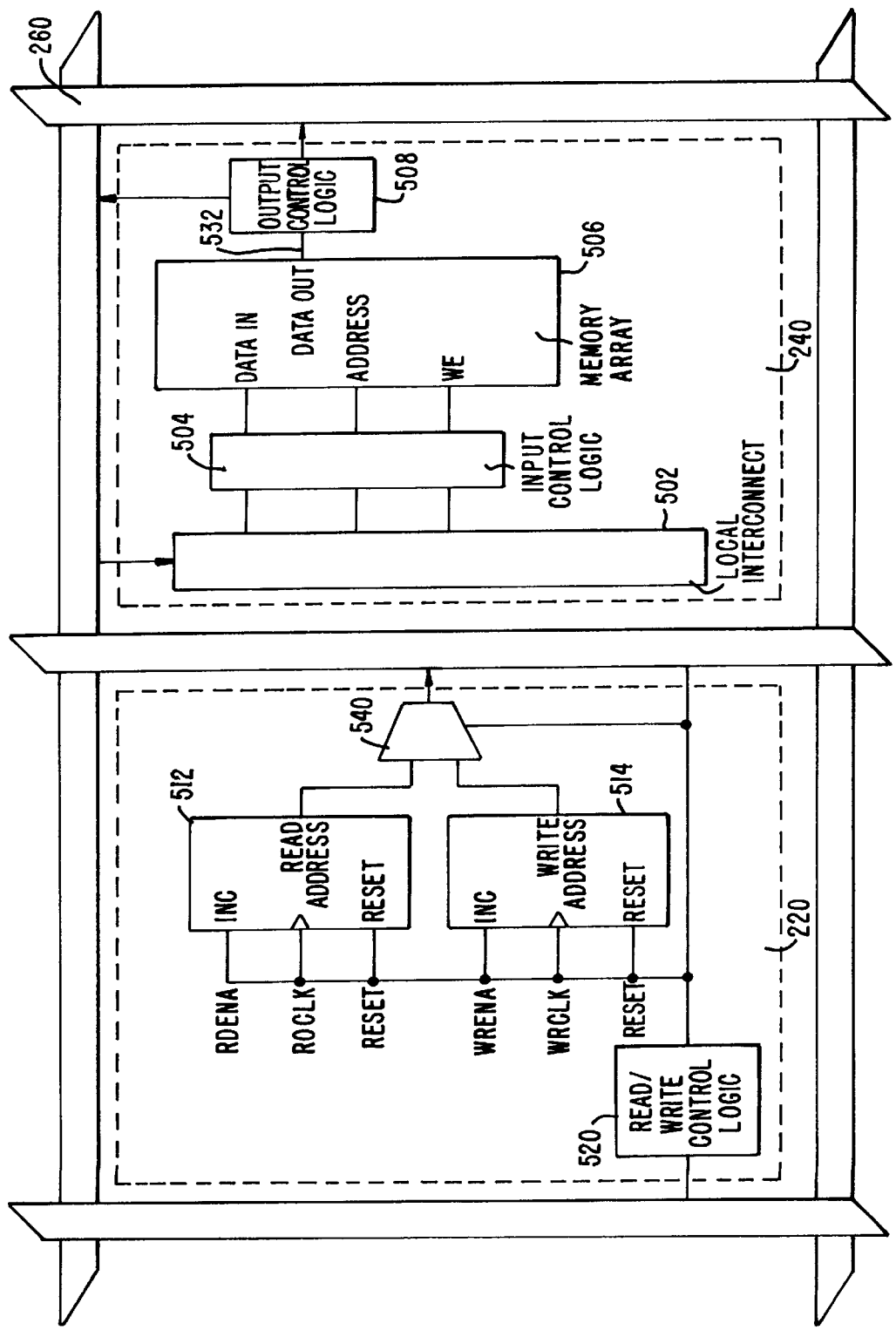
FIG. 5 is a block diagram of a first-in, first-out memory implemented in a programmable logic device.

Referring to FIG. 5, a block diagram of a known implementation of a FIFO is depicted for the programmable logic device of FIG. 2 using the embedded array block 240 that is shown in FIG. 4. Embedded array block 240 has a local interconnect 502, input control logic 504 (which contains all of the routing logic and registers between local interconnect 502 and memory array 506), memory array 506, and output control logic 508 (which contains the data output register and routing control).

Logic array block 220 is configured as a read address counter 512 and a write address counter 514. The function of read address counter 512 is to maintain the address of the next address location from which data is to be read. Each time data is read from the FIFO, read address counter 512 is incremented. Similarly, the write address counter maintains the address of the next address location to which data is to be written. Each time that data is written to an address, write address counter 514 is incremented.

Control signals for memory array 506, read counter 512 and the write address counter 514 are generated from read/write control logic 520. Typically, these functions require a read clock (RDclk), a read enable line (RDena), a write clock (WRclk), a write enable line (WRena) and a reset line (RESET). When the reset line is asserted, both address counters 512 and 514 are reset to an initial value. When the write enable line and the write clock line are simultaneously asserted, the data is written into the first address of memory array 530 and write address counter 514 is incremented.

When the read clock is asserted when the read enable line is active, memory array 506 places the data that is located at the address pointed to by read address counter 512 on data out line 532 and the read address counter 512 is incremented. Additional logic (not shown) is typically provided in order to prevent reading from an empty FIFO and writing to a full FIFO. Often, it is desirable to know when the FIFO is nearly full to give the user advanced warning before it is entirely full. For example, an application in which data is written to memory array 506 in blocks of data must know in advance to tell the sender to stop sending when there is only enough room for one more block of data. These functions can be implemented in several ways as is clear to one of skill in the art.

One way of determining the status of a FIFO is to compare the values in read address counter 512 and write address counter 514. Read address counter 512 will be equal to write address counter 514 when the FIFO is either empty or full. If only a write operation has just occurred and the counters are equal, the FIFO must be full. If only a read operation has just occurred, the FIFO must be empty. If a read and a write operation have both just occured, the FIFO remains in whatever state it was before, full, empty, or neither. Of course, other methods of determining the status for the FIFO will be readily apparent to one of skill in the art.

Another state that may be of interest is when the FIFO is nearly full. If a comparison of read address counter 512 and write address counter 514 shows the difference to be less than a defined value, then the FIFO is nearly full. The defined value may be programmable so that the application software is able to vary how full the FIFO is when it is warned of a nearly full condition by the hardware. A person of skill in the art can readily conceive of many alternative ways of accomplishing the same result. For example, a separate counter may be used that keeps track of the number of data values in the FIFO and the status may be derived from the value in the separate counter.

As specified above, embedded array block 240 is configurable to have from 256 addresses to 2,048 addresses. Hence, from 8 to 11 address lines are needed to uniquely identify each address location, depending upon the configuration of memory array 506. Since both read address counter 512 and write address counter 514 are used in the implementation of a FIFO, 16 to 22 address lines extend from the address counters 512 and 514 in logic array block 220 to the address lines of memory array 506 in embedded array block 240. Furthermore, along with the address lines, data and control lines also extend from logic array block 220 to embedded array block 500. It is desirable to not use so many interconnect lines. By reducing the number of interconnect lines, more room is available on the device for additional logic.

Past innovative designs have resolved this problem by multiplexing the read address counter and the write address counter within logic array block 220. Address multiplexer 540 allows read address counter 512 to be coupled to the interconnect lines during one-half of the clock cycle and the write address to be coupled to the interconnect lines during the other half of the cycle. By sharing interconnect lines in this way, the number of interconnect lines needed to provide memory array 506 with address information is cut in half.

Figure 6:
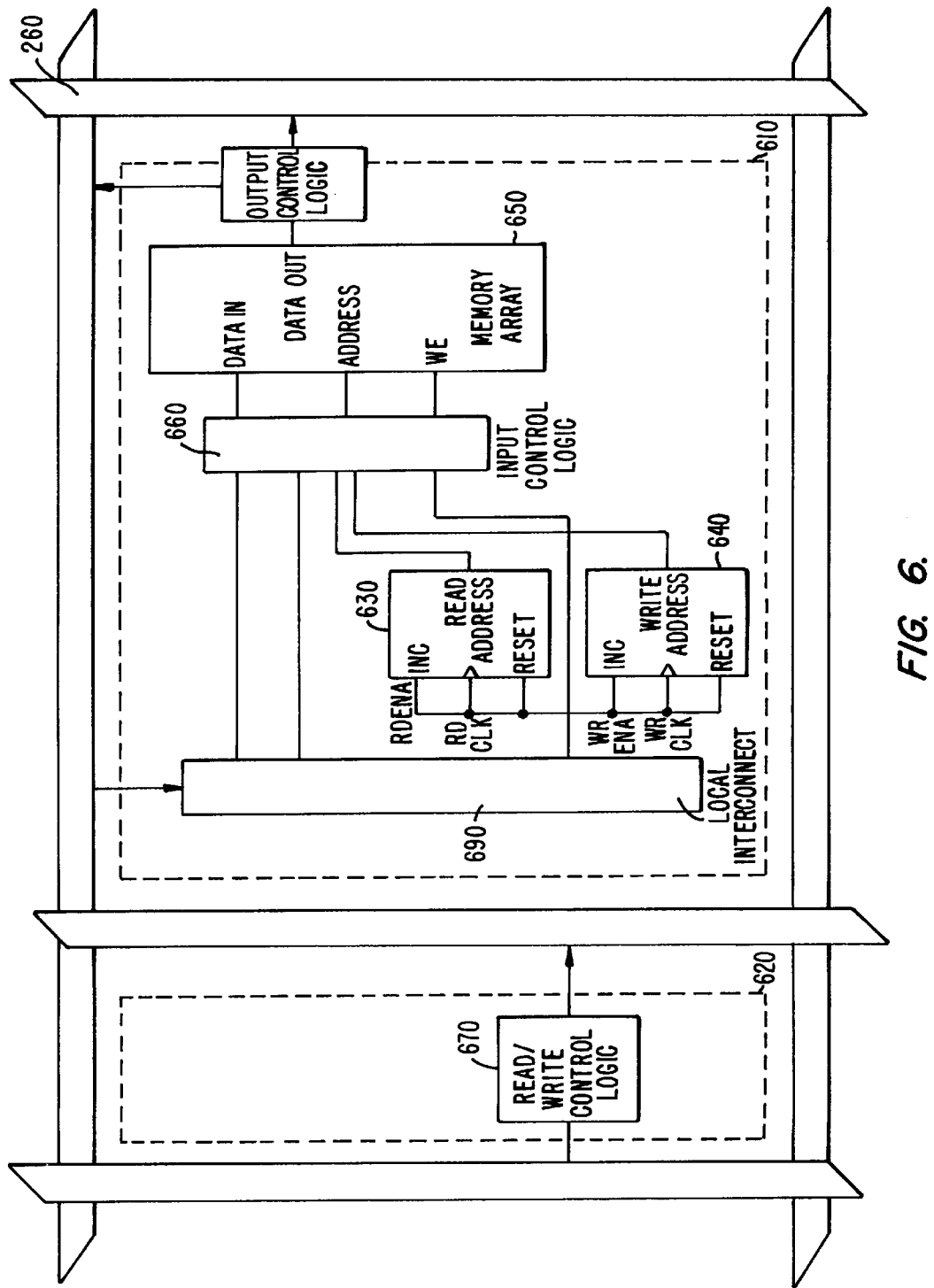
FIG. 6 is a block diagram of a first-in, first-out memory implemented in the enhanced programmable logic device of the present invention.

Referring now to FIG. 6, a block diagram of an embodiment of a programmable logic device of the present invention is depicted. The programmable logic device has an embedded array block 610 and a logic array block 620. Embedded array block 610 has a read address register 630 and a write address register 640. The outputs of read address register 630 and write address register 640 are coupled to the address lines of memory array 650 through input control logic 660.

Logic array block 620 is configured with read/write control logic 670 to generate the necessary control lines for a FIFO. Typically, these include a read enable line (RDena), a read clock (RDclk), a write enable line (WRena), a write clock (WRclk) and a reset line (RESET). The output of the read/write control logic is coupled with input control logic 660, read address register 630, and write address register 640 through interconnect grid 260 and local interconnect 690.

Because read address register 630 and write address register 640 are located within embedded array block 610, the control lines mentioned above and the data lines are the only connections that must be made through the local interconnect 690 or interconnection grid 260. This allows for a more compact and efficient FIFO design.

Figure 7:
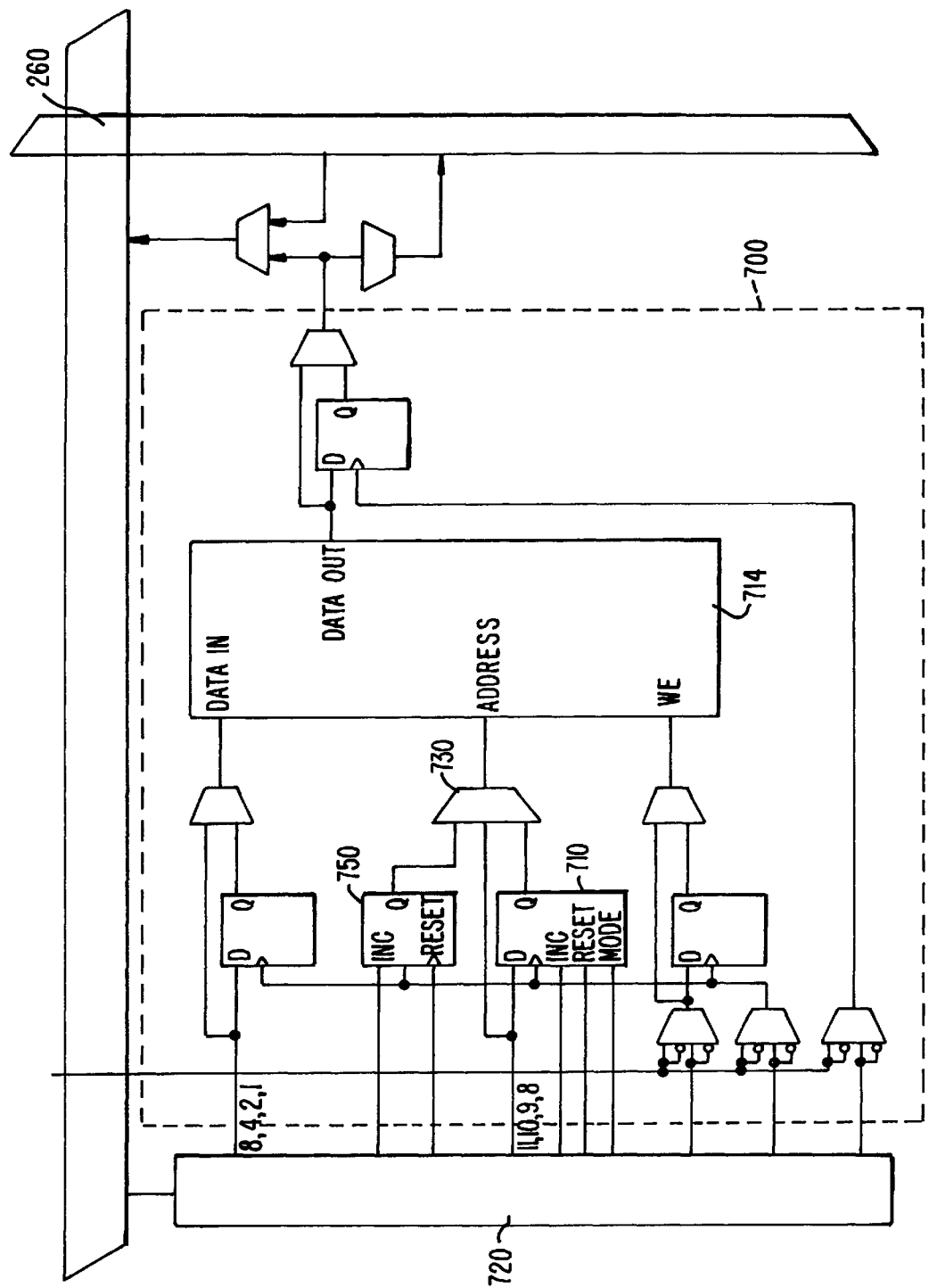
FIG. 7 is a diagram of a first-in, first-out memory with the read address register and the write address register multiplexed to a single address port.

FIG. 7 shows a more detailed diagram of embodiment of the present invention. An embedded array block 700 is a configurable logic block for use in a programmable logic device. Embedded array block 700 has two modes. The first mode is as a RAM memory that is randomly accessible to any address the user specifies on the address lines. The second mode is as a FIFO. An enhanced input address register 710 has two operating modes depending on the mode of embedded array block 700. When in RAM mode, enhanced input data register 710 operates as described above with reference to FIG. 4. That is, the address lines of memory array 714 are selectively coupled by routing multiplexer 730, either directly from local interconnect 720 or through enhanced input data register 710.

When in FIFO mode, enhanced input data register 710 operates as a counter to provide the function of a write address counter. As a counter, enhanced input data register 710 accepts control input from local interconnect 720. Its output is selectively coupled to the address lines of memory array 714 through routing multiplexer 730.

Embedded array block 700 also includes a read address counter 750. Read address counter 750 receives control input from local interconnect 720 and its output is selectively coupled to the address lines of memory array 714 through routing multiplexer 730.

By this arrangement, there is no need to use interconnect grid 260 or local interconnect 720 to couple the address lines from logic array block 220 to embedded array block 700. Write address counter 710 and read address counter 750 are located physically close to where the information they hold will be used. This saves on interconnection resources. It also improves the delay time associated with the address lines.

Figure 8:
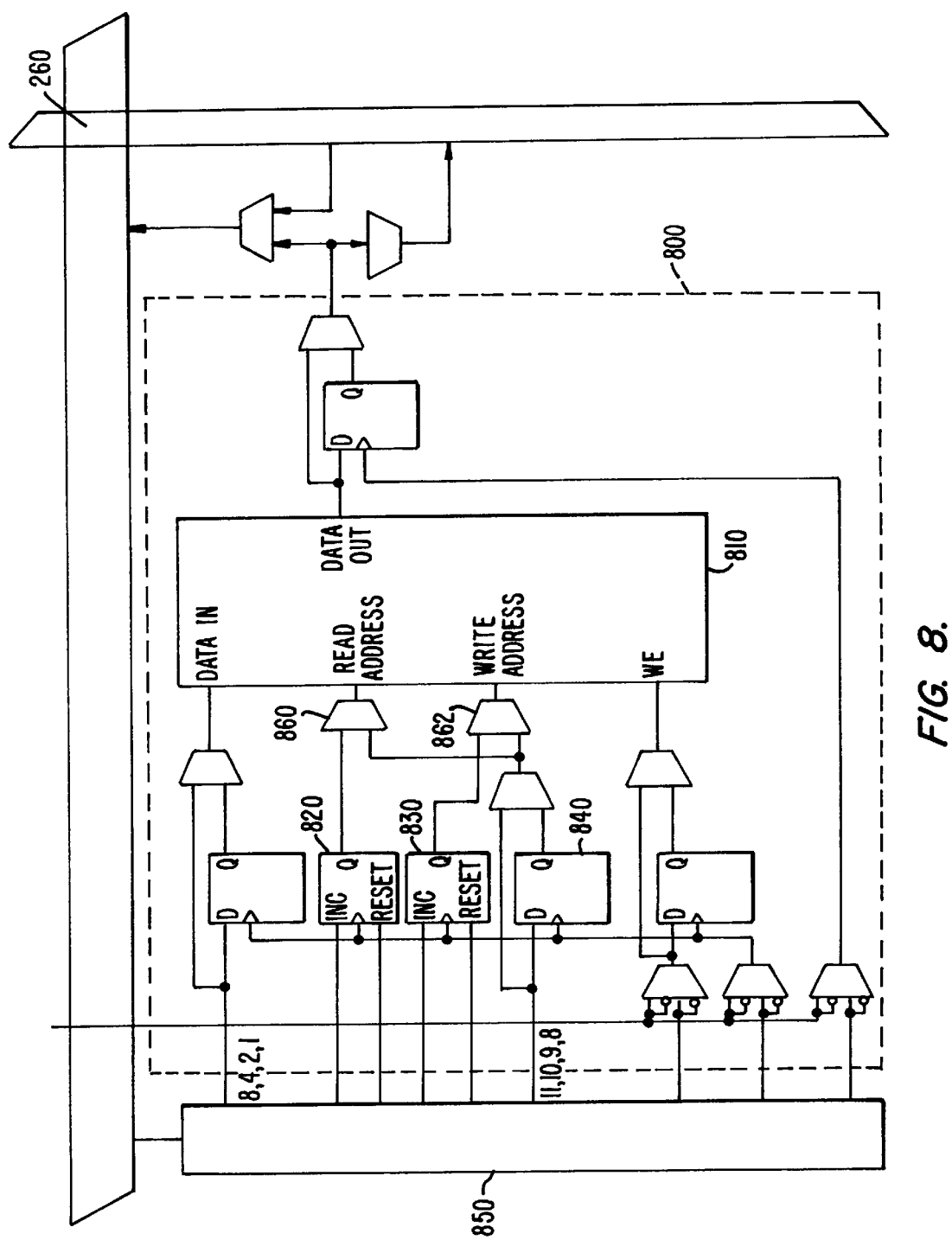
FIG. 8 is a diagram of a first-in, first-out memory with the read address register and the write address register coupled to separate read address and write address ports.

FIG. 8 shows another embodiment of the present invention that is a further improvement on the state of the art. An embedded array block 800 is a configurable logic block with an enhanced memory array 810. Enhanced memory array 810 has additional address inputs which allow it to be used as a simultaneous dual-port memory. That is, separate read and write address ports are available and enhanced memory array 810 can perform a write operation simultaneously with a read operation.

Embedded array block 800 also has a read address register 820 and a write address register 830. In RAM mode, the addresses are provided from data input register 840. However, when in FIFO mode, memory array 810 has its read address lines coupled to read address register 820 and its write address lines coupled to write address register 830. The control lines necessary for read address register 820 and write address register 830 are provided through local interconnect 850 and interconnect grid 260. Write address routing multiplexer 860 and read address routing multiplexer 862 select the source of the read address and the write address. In RAM mode the addresses come from data input register 840 or local interconnect 850. In FIFO mode, the addresses are provided by address counters 820 and 830.

Several advantageous features are readily apparent in the embodiment of the present invention shown in FIG. 8. As mentioned previously, the number of interconnect lines utilized by both local interconnect 850 and interconnection grid 260 in the implementation of a FIFO are minimized. Furthermore, in this embodiment, embedded array block 800 is operable as a simultaneous dual-port FIFO.

A dual-port FIFO is desirable in many applications. The key feature of a dual-port FIFO is that data may be written to the FIFO and read from the FIFO simultaneously. Separate read address lines and write address lines are provided so that each can be addressed individually.

Figure 9:
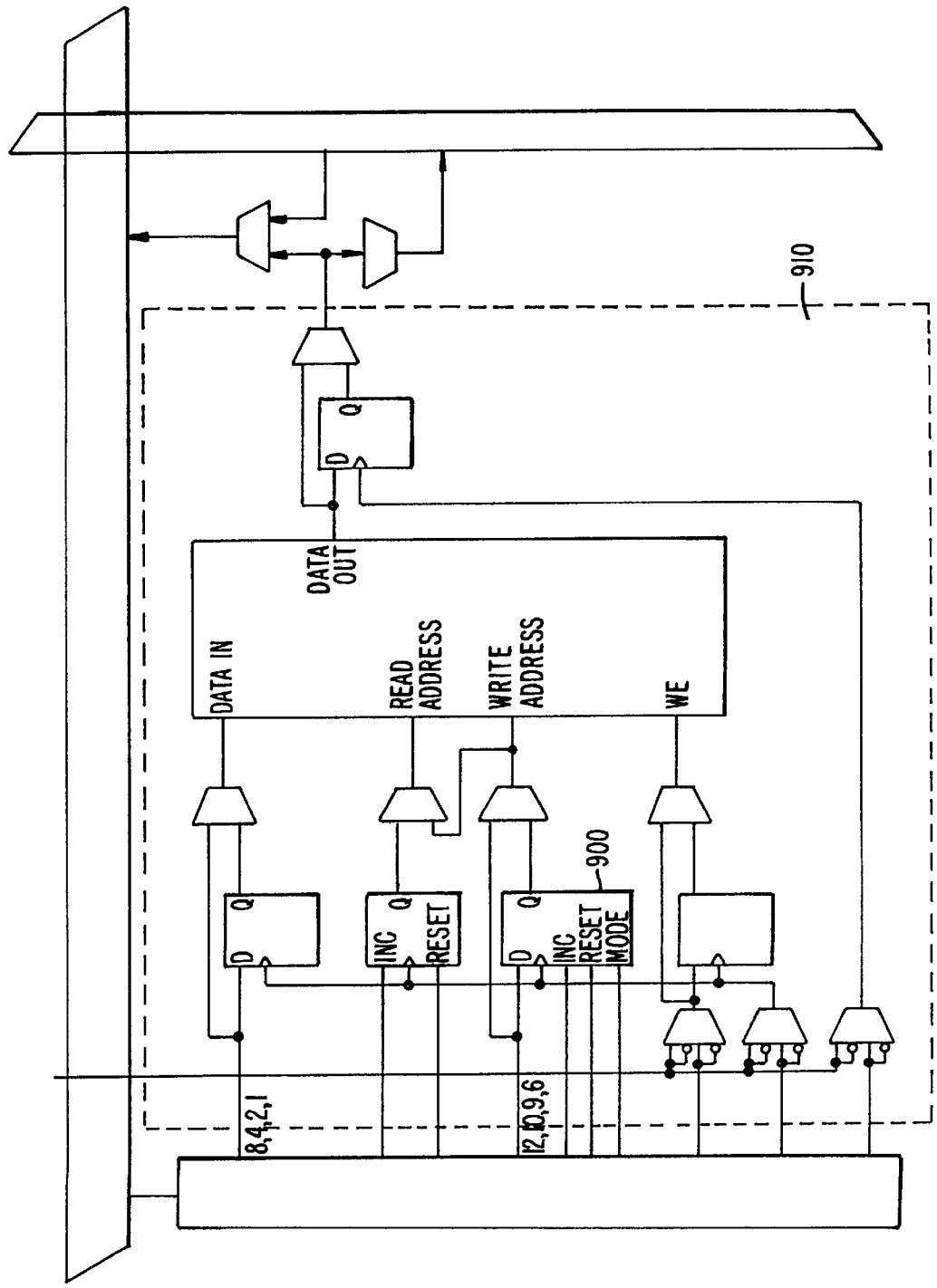
FIG. 9 is a diagram of a first-in, first-out memory with an enhanced write address register that is operable as a counter or as a data register.

Referring now to FIG. 9, another embodiment of the present invention is depicted. Additional logic is added to input data register 840 (shown in FIG. 8) to create an enhanced input data register 900 as shown in FIG. 9. The additional logic allows enhanced input data register 900 to operate in two separate modes. In RAM mode, it operates as a data register that latches whatever data is presented at the input. In the FIFO mode, enhanced data register 900 operates as a counter, incrementing its value by one for each clock pulse when the increment (INC) line is asserted.

This has the advantage of saving space in embedded array block 910. Since the write counter function is not used in RAM mode, and the input data register function is not used in FIFO mode, the extra register is a redundancy that is eliminated in this embodiment.

Figure 10:
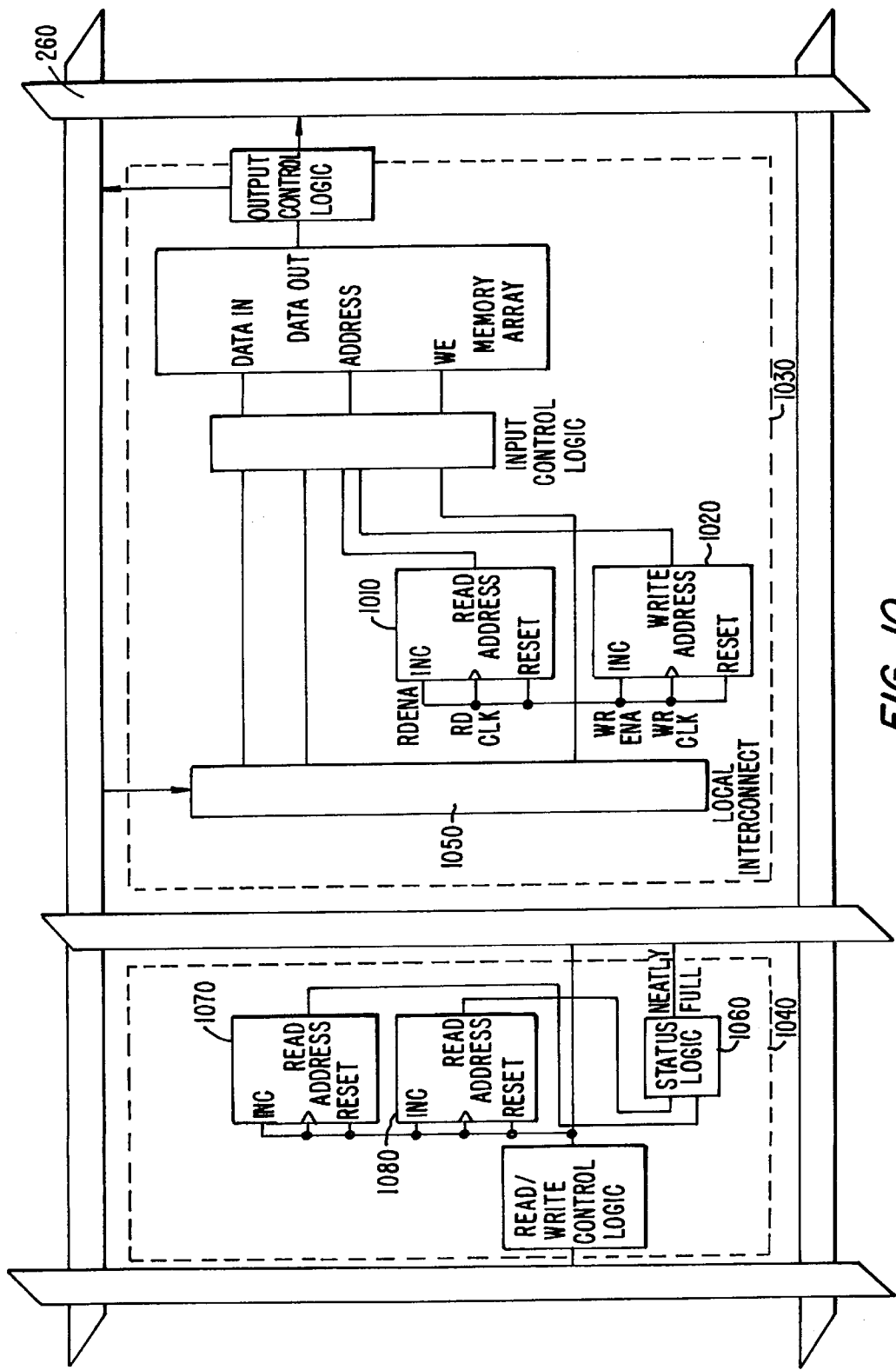
FIG. 10 is a diagram of a first-in, first-out memory with the read address counter and the write address counter duplicated in a logic array block.

FIG. 10 depicts yet another embodiment of the present invention. Therein, read address register 1010 and write address register 1020 of embedded array block 1030 are duplicated in logic array block 1040. In some applications, it is desirable to extract address information from read address register 1010 and write address register 1020 to determine the status of the FIFO such as when it is empty, full or nearly full.

In order to save interconnect lines in interconnect grid 260 and local interconnect 1050 as described above, address counters 1010 and 1020 remain within embedded array block 1030. Hence, the information contained in address counters 1010 and 1020 is not available outside of embedded array block 1030. By duplicating address registers 1010 and 1020 outside of embedded array block 1030, the information contained in them is accessible, without using precious resources of local interconnect 1050 and interconnect grid 260.

Logic array block 1040 is configured to contain status logic 1060. Status logic 1060 monitors duplicate read address register 1070 and duplicate write address register 1080. The outputs of status register 1060 are status flags indicating the status of the FIFO. For example, the output in this embodiment indicates when the FIFO is nearly full. Other embodiments, for example, indicate when the FIFO is full or empty. The status may be determined, for example, in the manner described above.

It will be understood that the foregoing embodiments are merely illustrative of the principles of this invention. Various modifications can be made by those skilled in the art without departing from the scope and spirit of the invention. For example, the size of the memory array can be altered, the logic can be spread around to multiple logic array blocks, and variations can be made to the interconnections. The examples given above are intended to aid in the understanding of the present invention, and are not intended to imply any limitation, other than those specified in the claims.

What is claimed is:

1. A method of operating a configurable logic block of an integrated circuit comprising:

providing a memory array with an address input;

providing first and second registers, each having a register output that may be selectively coupled to he address input;

providing a local interconnect comprising a plurality of signal routing conductors that may be selectively coupled to the memory array;

configuring the configurable integrated circuit to couple the register outputs of the first and second registers to the address lines without passing through the local interconnect;

maintaining a read address in the first register and a write address in the second register; and reading data from the memory array and writing data to the memory array in a first-in, first-out manner.

2. The method of claim 1, further comprising:

configuring the first register as a counter; and configuring the second register as a counter.

3. The method of claim 1 wherein the address lines of the memory array comprise a read address port coupled to the first register and a write address port coupled to the second register.

4. The method of claim 1 further comprising programming a configurable multiplexer to couple the first register to the address lines during a read phase and to couple the second register to the address lines during a write phase.

5. The method of claim 1 further comprising configuring the local interconnect to pass control signals to the first and second registers.

6. The method of claim 1 further comprising:

reading data from the memory array at an address stored in the first register; and writing data to the memory array at an address stored in the second register.

7. The method of claim 6 wherein the reading data and writing data are done concurrently.

8. A method of configuring a configurable integrated circuit comprising:

providing an interconnect grid comprising a plurality of horizontal conductors and a plurality of vertical conductors, wherein said vertical conductors may be programmably coupled to said horizontal conductors;

providing a plurality of logic array blocks programmably coupled to said interconnect grid;

providing an embedded array block comprising a memory array, first and second registers programmably coupled to the memory array, and a local interconnect programmably coupled to the interconnect grid, the first and second registers and the memory array; and programming the configurable integrated circuit to operate as a first-in, first out memory by coupling the first and second registers to the memory array without passing through the local interconnect.

9. The method of claim 8 further comprising programming the first and second registers to operate as counters.

10. The method of claim 8 further comprising programming a programmable multiplexer to couple the first register to the memory array during a read phase and the second register to the memory array during a write phase.

11. The method of claim 9 wherein the first register is configured to change values when data is read from the memory array and the second register is configured to change values when data is written to the memory array.

12. A method of operating a configurable integrated circuit comprising:

providing an interconnect grid comprising a plurality of horizontal conductors and a plurality of vertical conductors, wherein said vertical conductors may be programmably coupled to said horizontal conductors;

providing a plurality of logic array blocks programmably coupled to said interconnect grid;

providing an embedded array block programmably coupled to the logic array blocks through the interconnect grid, the embedded array block comprising a memory array, first and second registers programmably coupled to the memory array, and a local interconnect programmably coupled to the interconnect grid, the first and second registers and the memory array;

in a first mode, configuring the embedded array block to operate as a first-in, first-out memory with the first and second registers storing the read and write addresses respectively and providing the addresses to the address lines without passing through the local interconnect; and in a second mode, configuring the embedded array block to operate as a RAM.

13. The method of claim 12 further comprising configuring the first and second registers as counters when the embedded array block is in the first mode.

14. The method of claim 12 further comprising configuring the first and second registers as D-type registers when said embedded array block is in said RAM mode.

15. The method of claim 12 wherein in the first mode, the first register is coupled to write address lines of the memory array and the second register is coupled to read address lines of the memory array.

16. The method of claim 15 further comprising reading data from the memory concurrently with writing data to the memory array.

17. The method of claim 12 further comprising configuring a multiplexor in the first mode to couple the first register to the address lines during a read phase and the second register to the address lines during a write phase.

18. The method of claim 12 further comprising configuring the plurality of logic array blocks to duplicate said first register and said second register, and to provide a status flag representative of a status of said memory array.

19. The method of claim 18 further comprising asserting the status flag when said memory array is nearly full.

20. A method of configuring a configurable integrated circuit comprising:

providing an interconnect grid comprising a plurality of horizontal conductors and a plurality of vertical conductors, wherein said vertical conductors may be programmably coupled to said horizontal conductors;

providing a plurality of logic array blocks programmably coupled to said interconnect grid;

providing an embedded array block comprising a memory array and first and second registers programmably coupled to the memory array; and programming the configurable integrated circuit to operate in a first mode of operation as a first-in, first-out memory by coupling the first and second registers to the memory array without passing through the interconnect grid.

21. The method of claim 20 further comprising:

configuring the first register as a counter; and configuring the second register as a counter.

22. The method of claim 20 further comprising:

maintaining a read address in the first register; and maintaining a write address in the second register.

23. The method of claim 20 further comprising reading data from the memory array at the address stored in the first register concurrently with writing data to the memory array to the address stored in the second register.

24. The method of claim 20 further comprising writing to the memory array at the address stored in the first register during a first phase and reading from the memory array at the address stored in the seconf register during a second phase.

25. The method of claim 20 further comprising programming the configurable integrated circuit to operate as a RAM memory in a second mode of operation.

26. The method of claim 25 further comprising configuring the first and second registers as D-type registers in the second mode of operation.

* * * * *